(12) United States Patent
Ramm et al.

(10) Patent No.: US 8,968,830 B2
(45) Date of Patent: Mar. 3, 2015

(54) PVD—VACUUM COATING UNIT

(75) Inventors: Juergen Ramm, Maienfeld (CH); Christian Wohlbab, Feldkirch (AT)

(73) Assignee: Oerlikon Trading AG, Trubbach, Trubbach (CH)

( * ) Notice: Subject to any disclaimer, the term of this patent is extended or adjusted under 35 U.S.C. 154(b) by 1256 days.

(21) Appl. No.: 12/270,415

(22) Filed: Nov. 13, 2008

(65) Prior Publication Data

US 2009/0148599 A1    Jun. 11, 2009

(30) Foreign Application Priority Data

Dec. 6, 2007 (CH) .................................. 1890/07

(51) Int. Cl.
*C23C 14/22* (2006.01)
*C23C 14/32* (2006.01)
*C23C 14/50* (2006.01)

(52) U.S. Cl.
CPC .............. *C23C 14/325* (2013.01); *C23C 14/50* (2013.01); *C23C 14/505* (2013.01)
USPC ...................................................... 427/255.5

(58) Field of Classification Search
USPC ................................ 427/251, 255.5; 118/730
See application file for complete search history.

(56) References Cited

U.S. PATENT DOCUMENTS

| | | | |
|---|---|---|---|
| 5,709,784 A * | 1/1998 | Braendle et al. | 204/192.38 |
| 6,250,758 B1 * | 6/2001 | Yoshihara et al. | 351/163 |
| 6,328,857 B1 | 12/2001 | Anzaki et al. | |
| 2006/0118043 A1 * | 6/2006 | Wagner et al. | 118/723 E |
| 2008/0193724 A1 * | 8/2008 | Okamura et al. | 428/192 |

FOREIGN PATENT DOCUMENTS

| | | |
|---|---|---|
| EP | 0 293 229 | 11/1988 |
| EP | 0 928 977 | 7/1999 |
| EP | 1 186 681 | 3/2002 |
| JP | 10-317135 | 12/1998 |
| JP | 2000-141108 | 5/2000 |
| JP | 2001-049428 | 2/2001 |
| WO | WO 93/19217 | 9/1993 |
| WO | WO 97/34315 | 9/1997 |
| WO | WO 99/27155 | 6/1999 |
| WO | WO 2006/099760 | 9/2006 |

* cited by examiner

*Primary Examiner* — Erin Snelting
(74) *Attorney, Agent, or Firm* — Notaro, Michalos & Zaccaria P.C.

(57) ABSTRACT

A vacuum coating unit includes a reactive gas inlet, at least one PVD coating source with a laminar cathode and a substrate carrier containing a multiplicity of substrates. The substrate carrier forms a two dimensional horizontal extent, and the carrier is between at least two PVD coating sources. The substrates are cutting tools with at least one cutting edge in their peripheral margin region, which are distributed in a plane of the two dimensional extent of the substrate carrier. The substrate carrier is in a horizontal plane in the vacuum process chamber spaced between the laminar cathodes of the PVD coating sources and positioned such that at least a portion of each of the at least one cutting edge includes an active cutting edge and this active cutting edge is oriented opposite at least one of the cathodes of the PVD coating sources exposed at any time along a line of sight.

34 Claims, 8 Drawing Sheets

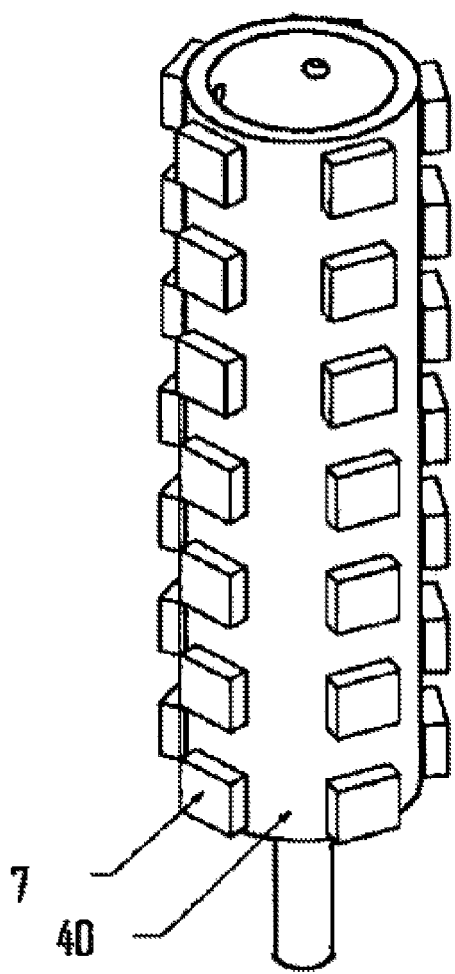 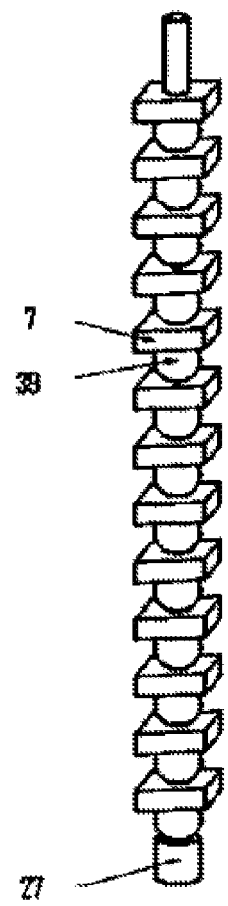
Fig.1a
(Prior Art)
Fig.1b
(Prior Art)

PVD—VACUUM COATING UNIT

FIELD AND BACKGROUND OF THE INVENTION

The invention relates to a vacuum coating unit and furthermore to a method for the simultaneously coating of several planiform or laminar substrates with a hard material coating.

There are PVD vacuum coating units with substrate mountings for tools such as machine tools, cutting tools like drills, cutting inserts, etc., which are optimized primarily for rotationally symmetric workpiece geometries, such as, for example, for shaft tools with different dimensions. Examples of this are production systems by OC Oerlikon Balzers AG Liechtenstein, such as the unit of type RCS described in EP 1 186 681 A1 and the unit of type BAI 1200 described in detail in EP 0 886 880 B1. Typical rotating mountings for indexable cutter inserts (cutting tools) utilized in these production systems are depicted in FIGS. 1a and 1b. The indexable cutter inserts 7 can herein be fastened, for example, on drum-like magnetic workpiece carriers 40 or be disposed on rods for tool receiver 27 and be disposed alternating with spacer pieces 39.

For the coating of small parts are known PVD units in which small parts rotate as bulk goods in grid drums and are thereby moved, while they are simultaneously exposed to the coating from cathodes disposed as the coating sources outside or inside the drum. Such methods, such as described for example in EP 0 632 846, have the disadvantage that through the movement of the drum the small parts impact one another or the drum and, consequently, especially in the case of hard metal parts, surfaces are scratched and sharp edges, such as cutting edges, are damaged.

CVD—coating units for cutting tools, such as indexable cutter inserts, have long been known. A typical example of such a unit type, in which indexable cutter inserts are laid out in grids and are coated in one or several planes is disclosed in WO 99/27155 A1, FIG. 4a of the reference. The chemical process for the deposition of the desired material out of the gas phase can either be excited only thermally or, as in the present document, additionally through a plasma, such as a pulsed plasma, applied between substrates and electrodes.

The applications CH 00518/05 and CH 1289/05 disclose pulsing the arc current either by simultaneously applying a DC and a pulsed power supply to an arc vaporizer source, or by applying a single pulsed power supply to two DC-fed arc vaporizer sources. In this way, several arc sources can be continuously and stably operated even if they are operated in high oxygen-containing or pure oxygen atmosphere and their surfaces are coated with an insulating layer during the process. It becomes thus possible to produce insulating, in particular also oxide, layers in PVD batch production plants.

Currently industrial PVD units for the coating of tools and structural parts are customarily not laid out such that they are only optimized for one substrate form and size. The reason for this is that in these coating systems, for reasons of economics and productivity, a multiplicity of very different substrate sizes and shapes must be coated and that for the PVD layers, customary up to now only thickness ranges from approximately 4 µm up to approximately 6 µm are targeted or that these can also not be produced at greater thicknesses due to the high residual stresses occurring in this case. In order to provide the workpieces with often complex, three dimensional structures uniformly with a layer system of several micrometer (µm) thickness, a multiple substrate rotation is therefore conventionally a requirement. However, this, in turn, leads to the fact that therefore in such methods only relatively low growth rates of a few µm/hr can be attained and therefore PVD units currently have relatively large coating chambers in order to make economic operation possible.

One disadvantage of such units, which in terms of substrate size and shape are universal, is the loading and unloading of the substrates into and from the mountings and into the unit. The demand for universality with respect to the substrates involves more likely an adaptation of the substrate mountings to the unit rather than to the substrates and thereby makes automation of the loading and unloading of the substrates difficult.

There are further significant disadvantages resulting from the universality demand. The dense packing of the substrates in the PVD production system and the rotation necessitated thereby continuously interrupt periodically the directed material flow of the PVD sources toward the substrate, while the supplied reactive gases act continuously onto the layer. There are approaches of disposing additional PVD sources centrally in PVD coating systems in order to relieve the problem. While this reduces the problematics somewhat, however it does not really resolve them since here also the material flow cannot be maintained at adequate constancy over time, at least not under the demand of high loading density at high productivity. The variation in the material flow of the PVD sources toward the substrate leads to a submultilayer structure in the layer build-up, thus to a variation of the structure or composition of the layer over the layer thickness. This can be advantageous, for example in view of the stress inclusion into the layer, however, it also entails disadvantages if very thick layers must be produced. This submultilayer structure depends primarily on the geometry of the substrate mountings. At the state of the present prior art the disadvantages outweigh the advantages and the coating with PVD batch plants is not economic due to the coating rates which are too low, in particular in view of thick oxide layers.

As a further highly important disadvantage of current PVD coating technology should be considered the layer thickness distribution on the tool. This will be explained in detail using indexable cutter inserts (depicted schematically in FIG. 2), however, but applies analogously also to all cutting tools which have cutting faces in different planes and are substantially of two-dimensional geometry. In the case of a mounting of the indexable cutter inserts for double or triple rotation, it is nearly impossible to generate at justifiable expenditures, for example, a uniform layer thickness on flank and rake faces, much less realize a given layer thickness ratio. For this realization to be successful, the freedoms under rotating operation in a batch plant are too severely restricted and such requirements can be neither fulfilled at defensible expenditures through an economic substrate rotation nor through a movement of the PVD sources.

This is one of the reasons for the coating of indexable cutter inserts with layers greater than approximately 6 µm that, for reasons of economy, primarily CVD methods have become widely established, which are capable of cost-effectively coating large batches (charges) with indexable cutter inserts in large-volume CVD coating systems in spite of moderate CVD coating rates. The CVD approach was until recently additionally supported by the fact that there was no PVD production technique available for the oxide production for indexable cutter inserts and only CVD appeared to be possible for this purpose. An important characteristic of CVD coating is the extensively uniform distribution of the layers over the indexable cutter inserts or the regions of the cutting edge, which in many cases is of advantage. However, it should here also be noted that this advantage becomes a disadvantage if a specified layer thickness ratio of flank and rake face must be realized on an indexable cutter insert. And, lastly, the high process temperatures in the CVD approach are not suitable for all tools and are therefore undesirable.

However, the manner in which the indexable cutter inserts are loaded and unloaded for the operation in the CVD coating system is significantly more efficient than in the PVD systems. This rests substantially on the fact that the indexable cutter inserts are laid out on plate-shaped grids. This approach to the substrate handling is primarily also determined by the preceding and succeeding fabrication steps, such as the sintering, the face, side and edge grinding, the sandblasting, polishing, etc., which are reasonable in small lot sizes of approximately 20 to 400 and whose machine working infrastructure is laid out for these lot sizes. The substrate handling accordingly is aligned in the CVD technique with the above stated lot sizes and only in the coating are 5 to 30 of such lots typically combined in one CVD batch for reasons of productivity.

Apart from the low coating rates, the diminished flexibility in the material selection among the coating materials, whose supply takes place via gaseous precursors, has been found to be a disadvantage in the CVD technology. For one, the availability of the appropriate precursors is limited, for another, rare precursors entail high production costs. Added to this is the fact that the gaseous precursors for certain materials can only be handled with difficulty so that the chemical reactions cannot be controlled as freely and independently of one another as is the case with PVD sources, and that CVD reactions must be regulated via the temperature and a greater multiplicity of the precursors in the process chamber impedes the control of the desired reaction. These are all reasons for the fact that using this technique only TiC, TiN, TiCN and $Al_2O_3$ layers could be produced until now. TiAlN layers, such as are, for example, possible in PVD without encountering problems and which have large advantages in many cutting applications, have so far not found their way into the standard CVD technology.

In conclusion, the disadvantages of the existing coating techniques can be summarized as follows:

PVD:
1. Unsuitable substrate handling for large batches of identical, primarily small two-dimensional substrates such as, for example, indexable cutter inserts.
2. Coating rates that, due to the necessary substrate rotation in large batch plants, are too low.
3. Rotation-dependent interruption of the material flow of the solid source toward the substrate.
4. Nearly impossible setting of the layer thickness ratio between flank and rake face.

CVD:
1. For reasons of economy, necessity of batch plants due to lower coating rates and long heating and cooling cycles.
2. Flexibility of the CVD process approach with respect to different materials since the precursor selection is restricted and the reaction mechanisms can essentially only be controlled via the process temperature.
3. Complicated process development for new materials and material combinations with high costs when using new precursors.

Conclusion:
It was recently possible to produce metal oxides by means of production-worthy PVD technique. However, in batch plants only low coating rates can be realized due to the necessary rotation, which is suitable for universal substrate sizes, however not specifically for indexable cutter inserts. The existing prior art is based on a rather unsuitable system with unsuitable substrate mounting or substrate handling, whereby the PVD technique is inferior in productivity to the CVD technique in certain application fields, which require especially thick layers and which make a very simple, partially automated handling of indexable cutter inserts reasonable. Furthermore, in PVD batch plants, for reasons of economy (as high a loading density as possible), the indexable cutter inserts most often must be mounted such that the flank face compared to the rake face is coated with thicker layers. This approach has in the past tended to support the specific usage feasibility of the indexable cutter inserts only for milling purposes, however, it is not a preferred approach for turning applications.

The CVD coating rates are low and the heating and cooling cycles long, giving rise to the necessity of large batch plants. The high temperatures and the inflexibility in the materials are disadvantageous. The combination of many lot sizes into one batch increases the process risk, interrupts the substrate fabrication flow and reduces the process control. The CVD technique is thereby limited and at least entails high costs for the development of new materials provided this is even possible at all.

SUMMARY OF THE INVENTION

The present invention addresses the problem of eliminating or of decreasing the disadvantages of prior art.

The present invention addresses in particular the problem of providing a PVD vacuum coating unit for the hard material coating of cutting tools, which in particular are implemented as nearly two-dimensional laminar substrates, such as preferably indexable cutter inserts (also referred to as inserts) and the like, which permit high productivity or very fast layer growth and are preferably suitable for application in the indexable cutter insert fabrication, i.e. permits simple automatable placement, and fits into the machine infrastructure of a CVD fabrication line for indexable cutter inserts. The coating installation is to permit high throughput even in the deposition of thick layers, in particular of poorly conducting, insulating layers, such as for example oxide-containing layers, in which the substrate mountings can have a substantially two-dimensional geometry and which can be equipped with a multiplicity of substrates and the coating can be carried out simultaneously at high economy.

The solution is to further permit replacing so-called batch systems in CVD and PVD technique and avoid the above described disadvantages in the current PVD and in particular CVD coating units.

A further problem comprises realizing a new configuration which combines PVD coating sources with substrate mountings such that similar substrate mountings in laminar shape can be utilized which can also fulfill handling requirements in the already utilized CVD coating technique and preferably no longer makes the rotation of the substrates absolutely necessary.

A high flexibility in terms of lot size as well as also in the layer design is further to be made feasible with this approach.

A further problem is the feasibility of coating cutting tools, such as in particular indexable cutter inserts, in which the layer thickness ratio of flank face to rake face can be varied and be selectively and specifically set.

A further problem is the simultaneous deposition with material from the PVD solid sources with as few interruptions as possible over the entire substrate surface during the coating without a potential substrate rotation interrupting the material flow of the solid sources.

A further problem is taking over in substantial points the typical elements of the implementation of existing and previously utilized CVD substrate mounting, and which so far fits only into this technique and was previously only suitable for coatings in batch plants, for a new PVD technique which permits higher coating rates, and therewith to maintain the remaining technical infrastructure of the indexable cutter insert production.

A further problem comprises realizing a PVD technique through the combination of CVD substrate mounting and PVD sources disposition for which preferably no substrate movement, such as in particular a substrate rotation, is necessary and yet a largely uniform layer distribution over the cutting faces of the indexable cutter inserts as well as also a specific layer thickness ratio for the different cutting faces of the indexable cutter insert can be attained.

The economy for the production of cutting tools at high flexibility of the settability of the desired layer parameters with the high coating quality to be attained is consequently to be substantially improved.

The problem is solved according to the invention through the claimed arrangement and method. The dependent claims define further advantageous embodiments of the invention.

The problem is solved according to the invention thereby that a vacuum coating unit comprises the following elements:
- a vacuum process chamber which is connected with a pump or pumping system,
- at least one reactive gas inlet which is connected to at least one reactive gas tank,
- at least one PVD coating source with an anode and a laminar cathode,
- a substrate carrier with a multiplicity of substrates,
- at least one gate disposed on the vacuum process chamber for the loading or unloading of the chamber with the substrate carrier or for the transfer into a further chamber,
- a transport device for transferring the substrate carrier through the gate and positioning it in the vacuum process chamber at a spacing in the region of the laminar cathode,
- at least one power supply connected with the at least one PVD coating source.

The substrate carrier in which several substrates are deposed is here implemented such that it is two dimensional with horizontal extension, wherein this carrier is positioned between at least two PVD coating sources. The multiplicity of substrates are cutting tools with at least one cutting edge formed thereon, which edge is disposed in the peripheral margin region of the laminar substrate. These substrates are distributed in a plane of the two dimensional extent of the substrate carrier, wherein the substrate carrier is positioned at a spacing in a horizontal plane in the vacuum process chamber at a spacing between the laminar cathodes of the at least two PVD coating sources such that at least a portion of each of the at least one cutting edge includes an active cutting edge and this active cutting edge is oriented such that it is opposite at least one of the cathodes of the PVD coating sources exposed in the line of sight at all times.

The active cutting edge is that portion of the edge on the cutting tool in the cutting insert which is utilized for cutting. The cutting edge includes at least one portion of each of the lateral faces along the edge, which are referred to as tool rake faces and tool flank faces.

During the coating process these cutting edges with the lateral cutting regions, consequently, are always exposed opposite at least one of the cathodes of a PVD coating source in direct line of sight. Thereby the material flow deposited onto the cutting edges is never interrupted at least in that portion of the edge which is the active cutting edge. The material flow can at most vary in the deposition rate. Thereby layers are deposited at high speed and simultaneously high quality. In certain cases the substrate carrier or even the substrates on the substrate carriers can be moved in order to attain an additional homogenization of the layer thickness distribution. Substrates can, for example, also additionally be rotated with respect to the substrate carrier via a drive. In such a case the cutting edges exposed are coated alternately by oppositely disposed sources, however, always in such manner that a material flow from at least one source is always applied on the at least one cutting edge or the at least two cutting edges of each substrate.

Considerably preferred is, however, a disposition in which the substrates are deposed such that they are stationarily positioned on or within the substrate carrier. The cutting edges, in particular if there are several for each substrate on its periphery, are thereby opposite the one or the other opposing source, each preferably assigned to the corresponding material flow of this source, depending on which edge or which edge portion is exposed in direct line of sight opposite the particular cathode of the source. In certain cases edge portions can also be acted upon from both sides depending on the position of the substrates in the substrate carrier arrangement. It is of advantage if the laminar substrates are deposed such that they are positioned at right angles one next to the other with respect to the laminar substrate carrier, advantageously at a minimal spacing from one another. In certain cases the substrates can be deposed at a slight inclination with respect to the plane of the substrate carrier in order to preferably expose additionally certain regions opposite the sources.

It is of advantage if the at least one cutting edge of each substrate on the substrate carrier is oriented on the correspondingly assigned side of the at least one cathode at all times such that it is at least exposed with 50%, preferably 70%, of its length in the line of sight with respect to it, and is here coated and is not shadowed here by the rest in the mounting or in the substrate carrier. Within this region is located the coated active cutting edge, such as is utilized in the cutting process with the cutting tool. It can thereby be achieved that the cutting edge to be utilized of the cutting tool is completely coated to the degree desired and is not disturbed by shadowing effects.

Since the material flow at the cutting edge to be coated is never interrupted, this flow can vary at most by a certain permissible degree, whereby a high layer quality with low residual stresses can be attained.

The efficiency (EFZ) of the PVD material flow can be defined in the following way:

EFZ: is the incorporation of target material bulk mass into the layer per unit time divided by mass loss of target material per unit time. This is a quasi transfer factor which states how much target material of the cathode arrives at the useful areas to be coated.

The variation of the deposition rate on the substrate face (active cutting edge) to be coated is denoted by delta (EFZ). This is the fluctuation in time of this value with the goal of reaching a uniform coating, with, or preferably without, substrate movement or substrate rotation, relative to the temporal mean value of EFZ. The delta (EFZ) should be maximally ±30%, preferably ±20%, preferably ±10%.

The substrate carrier with the laminar or areal extent can have, for example, a grid-form structure, in the interspaces of which a multiplicity of substrates can be simply placed during the loading. In the PVD vacuum process unit the desired regions of the cutting edges with the associated bilateral cutting faces can subsequently be coated simultaneously and highly economically in one process. Through the individual activation of the sources the coating of the lateral faces, the rake faces and the flank faces, can be set specifically with respect to one another according to specification, for example different layer thicknesses and/or material composition and/or layer properties.

With the present invention the following advantageous results are attained compared to prior art:
high coating rates with PVD sources through the advantageous geometry even without substrate rotation (20 µm/hr and more),
no interruption of the PVD source material flow, this makes possible a stress adaptation and thicker layers,
multilayer design is feasible,
simple substrate mounting which is handleable and automatable,
feasibility of multichamber systems through combination of the individual chambers for total process sequence in one chamber or division of the process sequence over several chambers,
adaptation of the lot size to the existing production and infrastructure,
short process or cycle times (1 hr compared to the previous 24 hr CVD, or 12 hr PVD previously)
targeted layer thickness ratios of flank to rake face of the workpiece are settable,
not any or highly reduced substrate movement,
economic handling of small parts such as indexable cutter inserts,
no necessity of a new infrastructure for the adaptation to CVD production lines.

The various features of novelty which characterize the invention are pointed out with particularity in the claims annexed to and forming a part of this disclosure and are entirely based on the priority application, Swiss Patent Application No. 01890/07 filed Dec. 6, 2007.

BRIEF DESCRIPTION OF THE DRAWINGS

In the following the invention will be explained in further detail by example and with schematic figures. In the drawing depict:

FIGS. 1a and b a typical mounting for indexable cutter inserts for twofold (a) or threefold (a and b) rotation, which is utilized in PVD batch production systems, according to prior art;

DESCRIPTION OF THE PREFERRED EMBODIMENTS

The substrates to be coated have substantially a two dimensional form or a laminarly extended form. This means that the side lengths a and b are substantially greater than the third side length c of the body, as is the case in the preferred cutting tools 7 to be coated, the indexable cutter inserts, and as is depicted schematically and by example in FIG. 2. The goal of the coating is to coat the cutting edges E with the associated flank face B and the rake face A. In such a cutting tool conventionally only a portion of edge lengths with the associated side faces formed on the tool is utilized in the cutting process. This portion is denoted as the active cutting edge E' and lies within 50% or even only 30% of the total length available on the workpiece of a cutting edge.

The dimensions E" of edge E in the flank face B, where the flank face wear D occurs, and from the edge E into the rake face A, where the crater wear occurs, are in the range of 50 µm to 5.0 mm and must also be coated. It can be advantageous to provide the coating in these regions of the rake face and of the flank face purposefully and selectively with a different layer thickness, which the present invention additionally makes feasible. Since the cutting tool only needs to be coated with the necessary high quality in these specified regions, the other not required regions on the tool can be utilized for the mounting, for example by placing it in a grid 25' with openings 25 on the substrate carrier or by using a hole 28 in the central region of substrate 7, which also is located in the unused region of the tool. Such laminar cutting tools do not need to have planar surfaces and can also be arcuate at individual sides or on all sides or they can also have other laminar contours or also include indentations or elevations, for example fastening means in a tool mount or for better chip flow in the material cutting operation.

The extent a, b of the preferred laminar cutting tools is advantageously in the range from 5.0 mm to 60 mm. Cutting tools are preferably polygonal laminar bodies.

Figure 2:
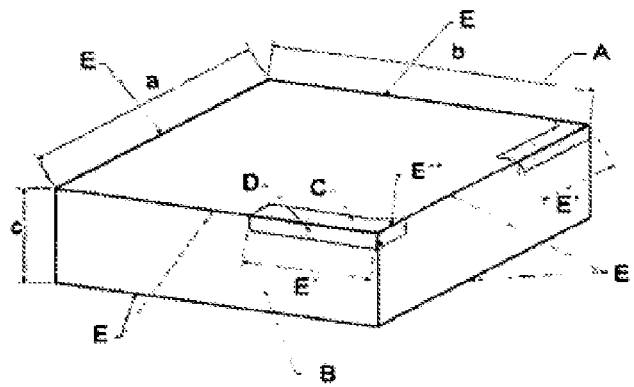
FIG. 2 schematic representation of an indexable cutter insert with flank face (B), rake face (A) and the regions which during the material removal are subject to crater wear (C) and flank face wear (D)

Triangular and rectangular bodies are preferably utilized, wherein the active cutting edges in these cases originate at the corners, as is depicted in FIG. 2. By turning the tool 7 about the central axis and/or by turning it over, after the wear of the active cutting edge E', a new unused active cutting edge E' can be set, as has been known for a long time in mechanical material working. Although less frequent, it is also possible to implement the cutting tool such that it is round, wherein in this case one or two edges E encompass annularly the cutting tool and subregions thereof can be utilized as active cutting edges.

In the preferred indexable cutter insert 7 depicted in FIG. 2 the active cutting edges E' to be coated with the associated lateral portions of the flank face B and the rake face A to be coated are located in the proximity of the 4 cutting corners. These faces from the corner of the indexable cutting insert for approximately 2 to 5 mm should be largely coated uniformly without the substrate carrier 6 leading to shadowing in the coating. For the cutting process the indexable cutting inserts 7 are conventionally utilized in the corners and for a few hundred micrometers along the edges. This is the region of the crater wear C and that of the flank face wear D.

Figure 3:
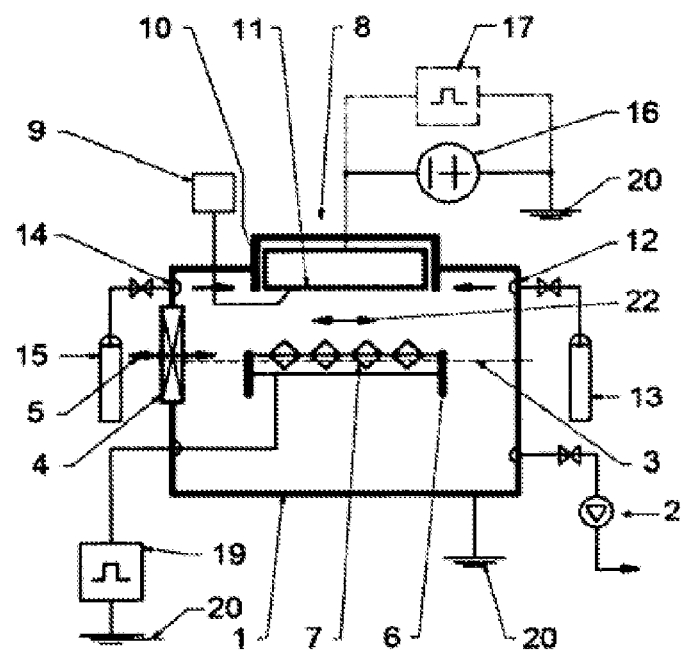
FIG. 3 schematic representation of a single-chamber system as an example with a PVD vaporizer source.

In FIG. 3 is depicted in highly simplified form the fundamental configuration of a vacuum coating system with which substrates 7, such as indexable cutting inserts mounted on a quasi planar substrate carrier 6, preferably a grid net, can be coated.

The system is comprised of a vacuum chamber 1, which can be evacuated via a pumping system 2. The workpiece carriers 6 with the multiplicity of workpieces 7 are moved through a loadlock gate or interlock 4 in the transport direction 5 on the horizontal transport plane 3 into the coating position in front of the source 8. The coating takes place with a PVD coating source 8, which is preferably an arc vaporizer source, which is equipped with an ignition device 9, an anode 10 and a cathode or target 11. For the reactive coatings the necessary reactive gases are introduced via at least one reactive gas inlet 12 from at least one reactive gas tank 13. In addition, an inert gas inlet 14, which is connected with the inert gas tank 15, is provided for inert gases such as argon. The reactive gas tank 13 preferably contains one of the gases nitrogen, oxygen, hydrocarbon gas, silane, borane, hydrogen, combinations of these gases and preferably oxygen for the reactive deposition of the desired layer compounds. Several reactive gas tanks 13, which contain various of such gases, can also be connected to the unit, in order to produce layer systems with multiple layers of different materials and/or to change the type of layer as desired. The arc vaporizer source is fed with a DC power supply 16, 16', 16" and/or with advantage with a pulsed high-current power supply 17, 17', 17".

Figure 4:
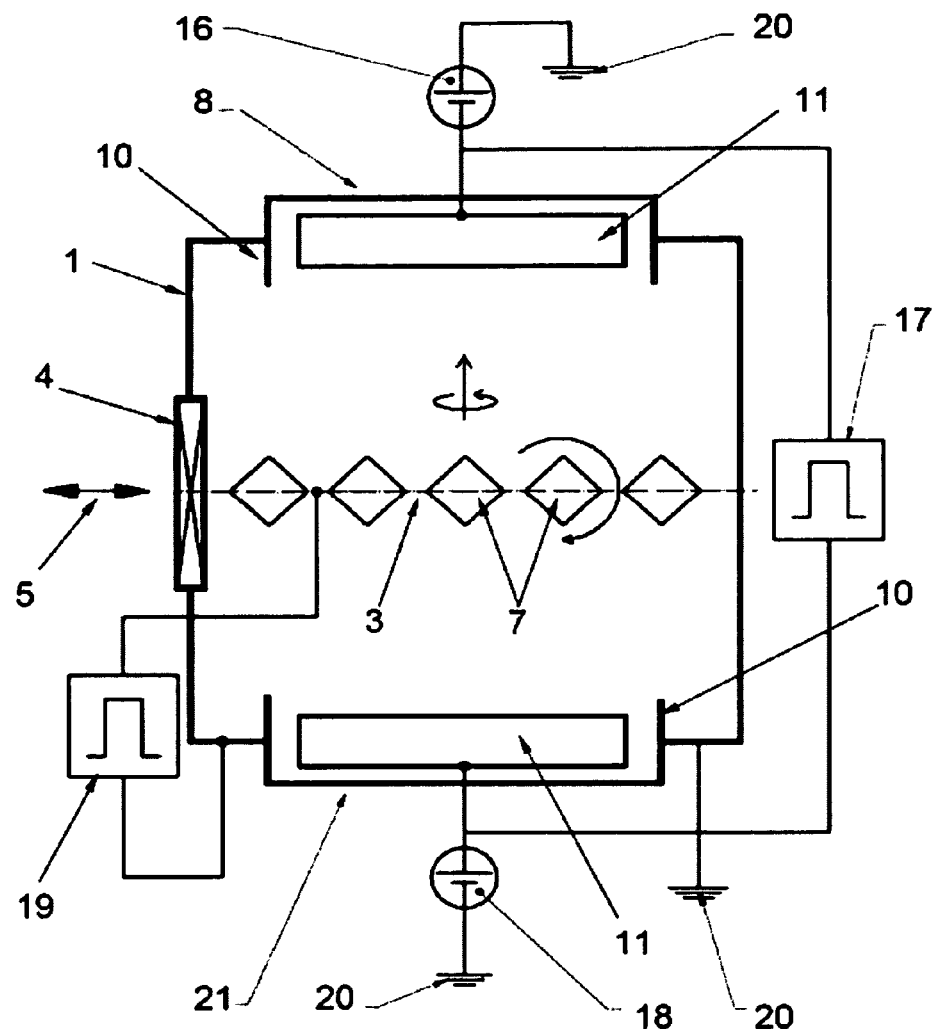
FIG. 4 schematic representation of a single-chamber system with two opposite sources and horizontally disposed laminar substrate carrier disposed between them.

According to the invention a further DC power supply 18 for a second source 21 on the opposing unit side is utilized as is depicted in FIG. 4. The substrate carrier in this case lies in a plane 3 between the two sources 8 and 21, preferably parallel to the laminar cathodes 11. Several laminar substrate carriers 6 can also be disposed, although a single large-area carrier is preferably utilized. Substrates 7 are preferably impressed via the substrate carrier 6 with an electric bias by means of a bias current supply 19, which can be implemented DC, AC, MF (medium frequency), RF, DC and/or, preferably pulsed, unipolarly and bipolarly. In the normal case all power supplies are operated against ground 20. However, in the arc vaporizer source there is the feasibility of keeping the anode 10 isolated from ground and to operate the source power supplies 16, 16', 16" 17, 17', 17", 18, 18' 18" therewith floating between anode 10 and cathode 11. Although the coating preferably takes place without substrate movement, there is the feasibility of moving the substrate carrier before, after or during the coating in the horizontal direction or also in the direction toward the one or the other cathode while maintaining the parallel orientation to the horizontal plane. Cathodes 11 can herein also be disposed such that they are tilted with respect to this horizontal plane in order to preferably favor the material flow into a certain direction. Feasible is also a rotation of the entire substrate carrier 6 about its vertical axis in the horizontal coating plane. Such a rotation is especially preferred when the layer thickness ratio of flank and rake face must be purposefully and selectively preset or different materials are to be deposited on these faces.

Figure 6:
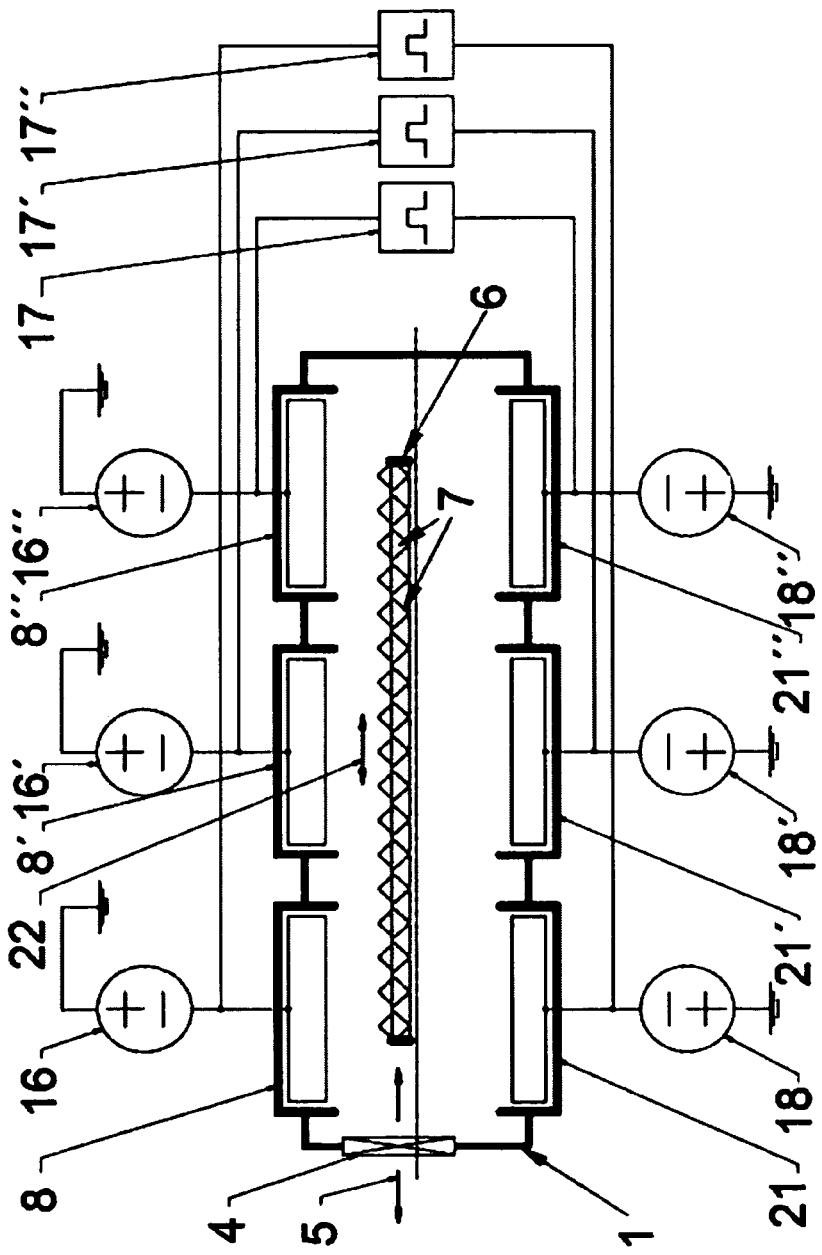
FIG. 6 concept drawings of an in-line unit with linear movement of the substrate carriers.

The PVD coating sources proposed here can be sputter sources, such as magnetron sources and/or preferably arc vaporizer sources. Preferred are at least two opposing coating sources 8, 21 which form at least one PVD source pair, and these are substantially disposed opposite one another, with the substrate carrier 6 disposed between them, wherein each of the two sources is operated with a DC power supply 16, 18 and preferably additionally both cathodes 11 of the two sources 8, 21 are operated with a single pulsed high-current supply as is depicted in FIGS. 4 and 6. The one source of the source pair is consequently positioned spaced apart above the substrate carrier 6 and the other source spaced apart below the substrate carrier. It is of advantage if there is at least one PVD source pair of arc vaporizer sources.

Figure 5A:
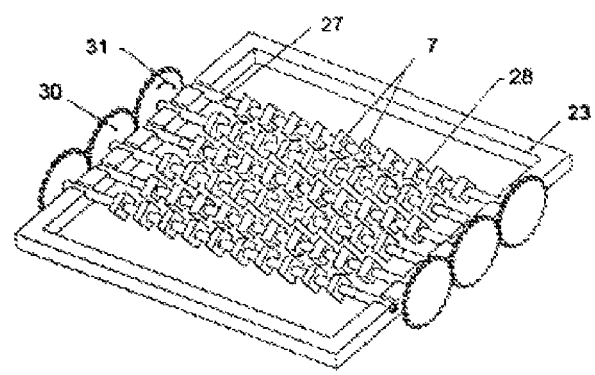
FIGS. 5a, 5b and 5c a: skewer mounting for indexable cutter inserts with hole, b: skewer mounting for indexable cutter inserts without hole, c: workpiece receiver with rotating skewers.
Figure 5B:
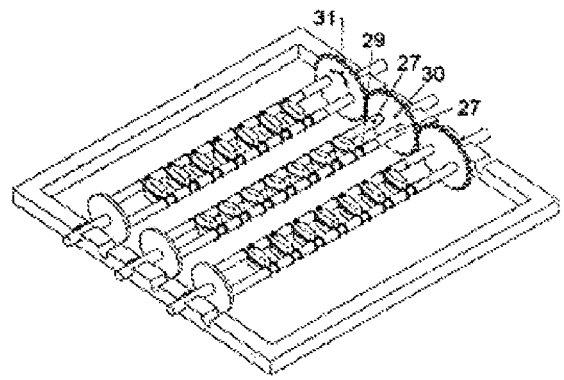
Figure 5C:
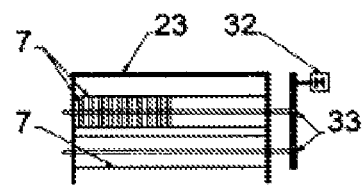

A configuration with only one source 8 on one side of the substrate carrier 6, such as is depicted in FIG. 3, alone does not make possible coating the substrate 7 all-around, in particular if these are disposed in an areally extended substrate carrier. For this purpose a rotation of the mounted indexable cutting insert 7 would need to be realized. For the generation of a rotation 31 serve workpiece receivers 27, a type of rods or skewers, which are placed in a frame 23 and on which the indexable cutter inserts 7 are mounted, as is depicted schematically in FIGS. 5a to 5c for indexable cutter inserts. In FIG. 5a this is depicted for indexable cutter inserts with hole 28 and without hole in FIG. 5b with the fastening element 29. The rotation is carried out via a rotary drive 30 with the rotation direction 31. The rotary drive is coupled with a gearing 33 and the motor drive 32. While the configuration with only one source and the rotation of the substrates 6 permits a sufficiently good layer thickness distribution, however the necessary layer qualities without interruption of the material flow in the coating are not attained and the demanded high economy of the process is not achieved. These problems are only solved through the configurations according to the invention with sources disposed at least pairwise opposite to one another with the laminar substrate carrier arrangement positioned between them, as is depicted in FIGS. 4, 6, 10. Additional rotating within the substrate carrier 6 in these arrangements can be desirable under certain conditions as long as the edges to be coated are ongoingly exposed to the material flow of the sources, thus this flow is not periodically interrupted. However, it is considerably more advantageous to work without such rotation and to place the substrate 7 after fixedly depositing them in the substrate carrier. The coating can thereby be better deposited on the desired regions on the substrate 7 and under individual control. The arrangement can be handled simpler and more economically. The edge portions to be coated are thereby always in the line of sight of at least one of the at least two sources and are exposed with respect to these. On the correspondingly associated side of the one cathode 11 thereby at any time at least 50 %, preferably 70 %, of the length of the cutting edge (E) is oriented toward the corresponding cathode such that it is exposed in the line of sight. As already described, movements 22 of the entire substrate carrier 6 are feasible in the horizontal plane and/or in the direction of the cathodes 11 between the at least one source pair. The stationary disposition of the substrate carrier 6 with the substrates 7 fixedly disposed therein is, however, preferred.

The disposition and number of arc vaporizer sources or arc sources utilized depends on their size, their source magnetic fields (if utilized), the arc current, the gas pressure set and the coating characteristics following therefrom and can be so optimized with the aid of simulation methods known to the person of skill in the art that a largely uniform layer thickness distribution can be attained on the regions to be coated of the substrates 7, in particular in the cutting edge regions to be coated of indexable cutter inserts. With a fixedly specified source disposition the source vaporization characteristic can further be affected and optimized by variable magnetic fields, the pulsing of the arc current and the gas pressure, which, additionally, makes feasible source configurations with even greater degrees of freedom than are depicted, for example, in FIGS. 3 and 4.

So far, the coating in single-chamber systems has been depicted. Since in production processes the throughput is of decisive economic significance, it is in many cases reasonable to combine several single-chamber systems as an in-line configuration or as a multichamber system in order to perform short process steps in one chamber without thereby the coating time proper being extended. Layer systems, which are based on different materials, such as for example TiCN/Al—Cr—O or TiAlN/Al—Cr—O can in this case be organized such that the Ti-based layers are finished in one system while the oxide layers are coated in a next system. The freedom to combine this substrate handling approach and the high coating rates with an in-line or multichamber system opens additional feasibilities for higher productivity, optimal process flow and greater material variety. These advantageous feasibilities will now be explained in further detail.

Figure 7A:
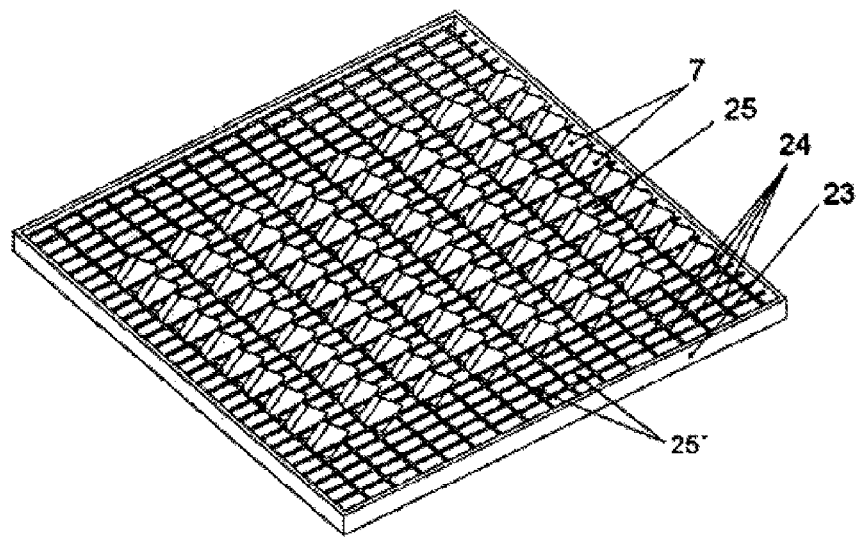
FIGS. 7a and 7b a: substrate carrier with indexable cutter inserts simply placed into rectangular gridding, b: placed into a circular grid.
Figure 7B:
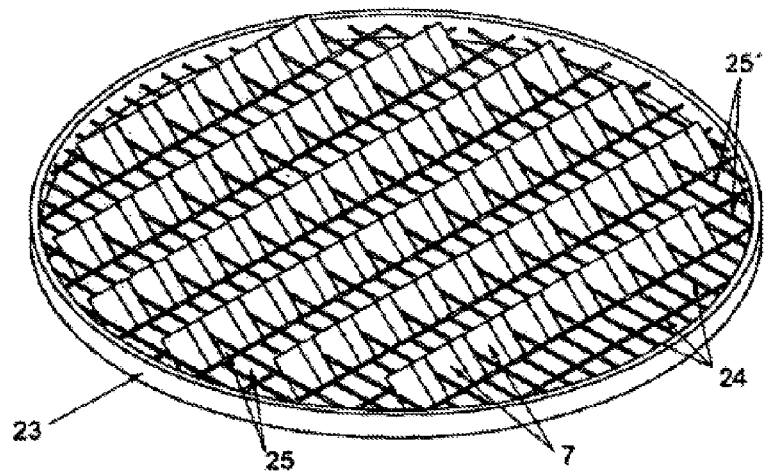

One advantage of the simple structure of the single-chamber system as discussed above, is that this can be expanded for a further increase of the productivity to in-line concepts or multichamber concepts. FIG. 6 shows the way in which an in-line system based on this concept is structured. A multiplicity of indexable cutter inserts (workpieces) 7 are again laid out on at least one workpiece carrier or substrate carrier 6. As a simple form, these are implemented as a type of grid, such as is depicted in FIGS. 7*a* and 7*b*. The workpiece carrier 7 is comprised of a frame 23 encompassing the grid-like workpiece rest 24 with the corresponding multiplicity of openings 25 for the placement of the substrates 7 into these openings. The workpiece rest can preferably be implemented as a grid 25' and is preferably fabricated of a conducting material, for example as a wire grid 25', in order for a bias voltage to be applied in simple manner on the substrates 7. This at least one workpiece carrier 6 is either transported via differential pumping or in corresponding pre-chambers into the process pressure environment. A pretreatment, such as heating and etching, can, for example, be carried out in pre-chambers. The coating in this case takes place in the system, as is depicted in FIG. 6, by transporting the substrate carriers 6 with a transport device 5 via a gate 4 or a loadlock into this system and transporting 22 them between the sources to be, lastly, cooled again, for example, in a further chamber and be brought to atmospheric pressure again (not shown) or transported back via the original pre-chamber and transferred outward through an loadlock gate.

Figure 8:
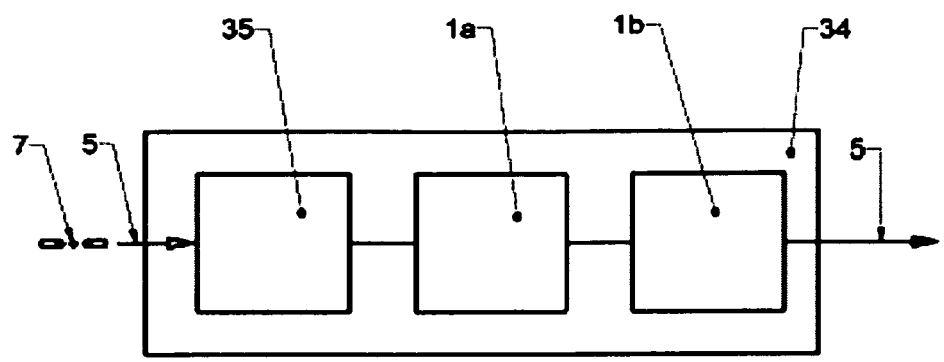
FIG. 8 concept drawing of an in-line unit with separate process chambers.

For multilayered layer systems, if, for reasons of productivity or process technology, they are not to be produced in a single-chamber system or multilayered layer systems, which must be produced with different reactive gases and in which, as a consequence, "cross-talking" or the risk of "cross contamination" of the discrete process step must be avoided, the individual chambers are correspondingly isolated either through differential pumping or through valves or loadlocks or loadlock gates, such as depicted in FIG. 8 which shows such a multichamber in-line system 34. Loadlocks and pretreatment chamber(s) 35 are isolated using vacuum techniques from the coating chambers 1*a*, 1*b* proper by valves or loadlocks, loadlock gated or interlocks and/or differential pumping.

Figure 9:
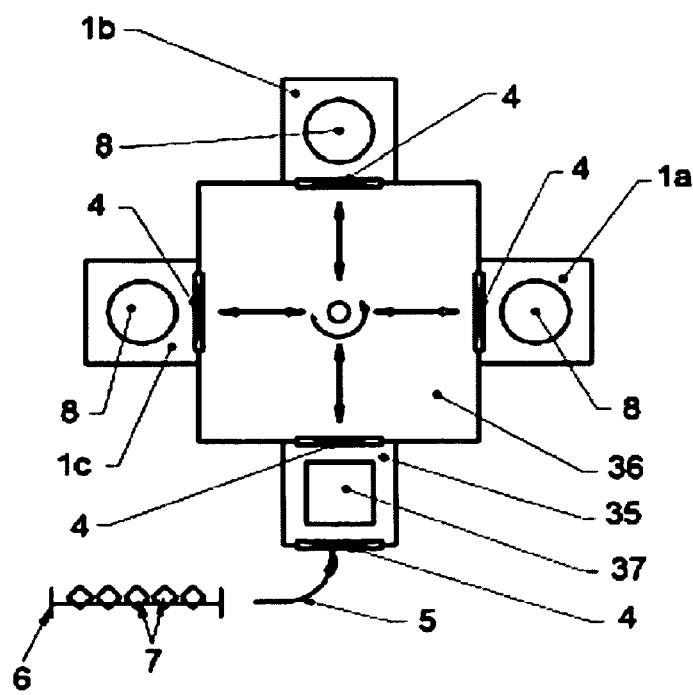
FIG. 9 multichamber system with central transport chamber and pretreatment chamber.

A preferred version of a multichamber system 34, as far as the flexibility in the formation of the process sequence is concerned, is depicted in FIG. 9. In this multichamber system 34 the individual chambers 1*a*, 1*b*, 1*c* are connected such that they communicate with one another via a transport chamber 36 with central handling system and the substrate carriers 6 with the multiplicity of emplaced indexable cutter inserts 7 are, according to a specified process sequence, transported from one single-chamber 1*a*-1*c* to the other. The advantage of such a unit is that process steps of different length with high duty cycle can also be inserted into the process sequence. A further advantage is, for example, that the coating with oxidic and nitridic materials can proceed in different process chambers and that these chambers in each case only need to be equipped with the requisite components especially for these coatings. This advantage is especially clear for the pre- and posttreatment steps such as heating, etching, cooling or other plasma treatment steps, for example in a pretreatment chamber 35 with treatment device 37, which serve only for the surface modification of substrates or layers and therefore have other typical process times than the coating steps. However, the flexibility of such a system is also important when different layer thicknesses must be coated in small lots. In that case, as stated, an effective process sequence can be adapted to the processes to be implemented.

In the following descriptions reference is again made to a single-chamber system 1. Based on the previous explanations it is evident that such single-chamber systems 1 can be combined modularly in the previously described manner to form multichamber systems 34. In addition, in the following descriptions primarily the preferred arc sources 8, 21 are mentioned although the use of sputter sources leads to similar results. The arc sources 8, 21, however, are the preferred PVD sources for the process concept described here. One reason is that, if necessary for reasons of uniformity and if a large number of sources or source pairs are to be operated, these can be kept geometrically small. This is therefore especially simple with arc sources since it is possible for many applications to work with small (and therefore also structurally small) or no source magnetic fields. The arc sources have preferably a magnet system, with which it is possible to generate at the target surface a very small perpendicular magnetic field, for example between 3 and 50 Gauss, however preferably in a range between 5 and 25 Gauss. Alternatively, and especially preferred in view of the small overall size, the arc sources are operated entirely without magnetic fields and, nevertheless, with arc vaporizer sources especially high vaporization rates can be attained.

A further reason for preferring arc sources in this context comprises that through the, also preferred, pulsed operation of the sources the directional effect of the vaporized source material can be affected. In other words, for pulsed arc sources it is especially simple to work with a multiplicity of structurally small arc sources, which, in turn, has a positive effect on the layer uniformity. Moreover, the vaporization rates in arc sources can be easily set such that coating rates up to 20 μm/hr and greater are attained on the substrates 7, such as preferably on indexable cutter inserts.

In the arc vaporization is preferably connected a pulsed bias supply, preferably bipolar, for example with short positive and long negative voltage pulses, alternatively with AC voltage (AC) and/or DC supply on the substrate carrier 6 and in each instance a DC generator for the operation of each arc source. Additionally, the arc sources are preferably also connected to a pulse generator and specifically either with a pulse generator between two arc sources, thus an arc source pair, or a pulse generator for each arc source parallel to the associated superimposed DC supply, as has been described in WO 2006/099760 and which is herewith declared to be incorporated as an integrating part of this application.

An electronic ignition arrangement is advantageously utilized, which permits the ignition of the arc sources even if the cathodes (targets) are covered with an oxide coating.

In single-chamber systems are advantageously provided a gas inlet system with a connection for at least one inert gas 14 for heating or etching steps and connections for at least two reactive gases 12 (for example nitrogen, oxygen, hydrocarbon gases, borane, silane, hydrogen, etc.) for the coating. Therewith it is possible in simple manner to produce with only one target material multilayered layers of different materials. For example, a metallic adhesion layer, followed by a nitridic or carbidic hard layer, followed by an oxidic cover layer with hard or even blurred transitions between the individual materials of the different layer regions can be deposited. The production of multilayered layers with micro- or nanometer thick coating layers can thereby also be set simply, since for this purpose only an appropriate change of the gas flows, for example nitrogen and oxygen, have to be carried out. Such systems can, for example, be comprised of alternatingly deposited TiAlN/TiAlO, CrAlN/CrAlO, ZrAlN/ZrAlO layers.

Figure 10A:
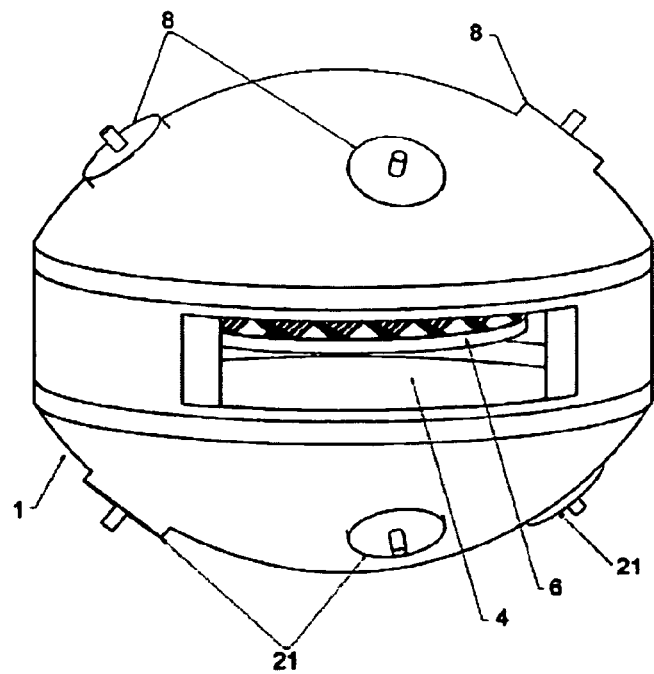
FIGS. 10a and 10b schematic representation of a preferred PVD coating unit with opposite arc source pairs (a) and two-dimensionally extended substrate carriers disposed between them as well as for clarification a sectional representation of the same (b).
Figure 10B:
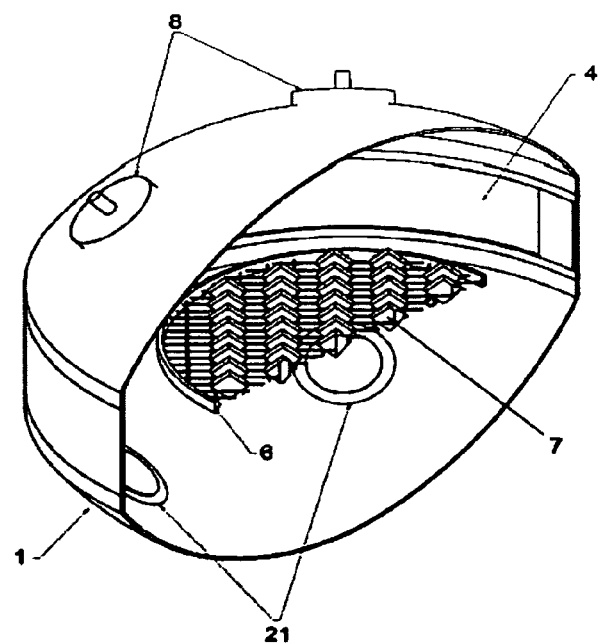

In FIG. 10a is schematically depicted a preferred PVD arc source arrangement 8, 21 for a single-chamber system 1 and as a two-dimensional section (b). With such an arc source arrangement a nearly complete all-around coating of the cutting edge regions of substrates 7 to be coated, such as in particular of indexable cutter inserts, is attained with good uniformity of the coating on the particular cutting faces E on both sides of the substrate carrier 6. The manipulation or the handling of the indexable cutter inserts is, as already stated, simple and strongly follows the CVD handling and the existing infrastructure in CVD technology. In FIG. 10b the indexable cutter inserts are simply emplaced in grid nets 25', as is depicted in greater detail in FIGS. 7a and 7b. Depicting the feasibility, familiar to the person of skill in the art, of deposing the substrate carrier in the chamber has been omitted in the drawing for reasons of clarity. The uniformity of the coating is attained through the arc source arrangement 8, 21, which are disposed in the receptacle wall. Ideally, however not absolutely, the receptacle is comprised of two semispherical parts, in the center of which the substrate carrier 6 with the grid net 25' with the indexable cutter inserts 7 is positioned (FIG. 10). For multilayer systems, which are based on different source materials, correspondingly several sources, in particular source pairs with sources disposed opposite one another, for different materials must be provided. It is advantageous to dispose the sources on the chamber wall such that they are accessible from the outside, as is shown in FIG. 10. However, sources can also be positioned within a vacuum chamber whereby, in this case, the chamber wall does not need to be implemented additionally, at least in the source region, inclined or arcuate, if the sources are to be oriented toward certain regions of the substrate carrier arrangements. Additionally, ionization sources or orifice plates can be disposed in front of the arc sources and heating means in the chamber, which is not shown here, but which is known to the person of skill in the art. FIG. 10 depicts an especially suitable arrangement with four source pairs 8, 21, thus with a total of eight sources, which are directed at minimal inclination with respect to one another toward the substrate carrier. The coating conditions on the regions of the substrates to be coated can thereby be well set, for example of the deposition rates through individually differing feeding of the sources with differing arc currents or source power and/or of the layer composition with differing materials. These settings can also be varied during operation whereby even different profiles, for example, of the layer composition and/or of the crystalline layer structure can be implemented. Only two source pairs or more than 4 source pairs, depending on the application, can also be utilized. The source pairs can also be disposed in one direction, preferably, for example in one line, depending on how the substrates 7 are directed with respect to the position of their cutting edges E in the substrate carrier 6 and certain regions of the substrates 7, for example of the cutting face, are to be coated more or less in a certain preferred manner.

In contrast to the existing prior art, in this coating system according to the invention the at least one source arrangement 8, 21, which pairwise are located opposite one another, and the laminar layout of the substrate carrier 6 located in between them, replace a necessary substrate rotation. The high vaporization rates of the PVD sources, furthermore, make feasible an economically high coating rate on the substrates 7.

During the coating the cutting edges with the cutting faces of the indexable cutter inserts are exposed uninterruptedly to the material flow of the solid sources, which makes specific multilayer structures on the substrate feasible without a rotation effect of these structures taking place. This property of the introduced process solution is of great significance for thick layer systems in which the layer stress and other layer properties, such as for example the hardness, must be controlled.

Although, with advantage, the coating can take place without substrate movement, it can additionally be feasible to connect the substrate carrier 6 with a movement device 22 which, for example, moves this carrier periodically relative to the PVD coating sources 8, 21, preferably in a horizontal movement, such as, for example, parallel to the horizontal transport plane. Thereby a further homogenization effect can be attained without generating undesirable shadowing on region of the substrate 7, as would occur in the known rotation movement. The substrate carrier 6 can receive at least 30 substrates 7, preferably up to maximally 1000. A highly suitable lot size is preferably at least 200 pieces up to maximally 600 pieces.

An especially important hard material coating arrangement includes a source, in which at least one cathode 11 includes one of the materials Al, Cr, Ti or Zr or their alloys, wherein at least one reactive gas tank 13 contains the gas oxygen for the reactive coating.

The unit can include outside of the vacuum a charging robot for the efficient loading or unloading of the substrate carrier 6 with the substrates 7, wherein such robot is operationally connected with the transport device 5. The unit gate 4 can be developed as a vacuum interlock or loadlock gate for the inward transfer of at least one substrate carrier 6 into a pretreatment chamber 35 and/or vacuum process chamber 1, 1a-1c.

At least two, preferably several, vacuum chambers 1, 1a-1c can be operated under operational connection and communicating with one another via openings 4, preferably via loadlock gates 4, for the execution of several process steps, wherein at least one of the vacuum chambers 1, 1a-1c includes at least one arc vaporizer source 8, 21.

On one side, preferably on both sides, of the laminar substrate carrier 6 at least two arc vaporizer sources 8, 8', 8", 21, 21' 21" can be disposed and the faces of the associated cathodes 11 can be disposed such that they are directed at an inclination with respect to one another in the direction of the substrate carrier 6 for focusing the material flow onto preferred regions of substrates 7, wherein the sources 8, 21 are preferably individually operable, for example by setting the arc current or the electric power and/or the pulse conditions. Preferably disposed on one side, preferably on both sides, of the laminar substrate carrier 6 at least four arc vaporizer sources 8, 8', 8", 21, 21', 21" are operated and the faces of the associated cathodes 11 are disposed inclined with respect to one another in the direction of the substrate carrier 6, wherein the sources are preferably individually operable.

For the preferred substrates 7, such as cutting tools and in particular for indexable cutter inserts, in economic manner a layer deposited on the substrate 7 on the side faces of the active cutting edge E is generated with thicknesses in the range from 0.1 μm up to 50 μm.

FIG. 10b illustrates the simple approach of substrate handling on grid nets 25'.

In the case of the frequent rectangular indexable cutter insert geometry, for example, advantageously a grid 25' with relatively thin wires can be utilized, wherein the meshes or the opening 25 in the grid are so laid out that the individual indexable cutter insert rests in the middle between two bordering peripheral areas (FIG. 7). This ensures that the coating of the edges and corners and the cutting face regions, which are later exposed to the material removal process, takes place uniformly. The preferably electric contacting, in particular in bias operation, herein also takes place via the grid 25'. For indexable cutter inserts with hole 28, for example, a grid with rods 27 guided through the holes is suitable such as is depicted in FIG. 5a, preferably without rotation means.

It has been explained above that the combination of quasi-two dimensional substrate mounting and PVD source disposition makes feasible a largely uniform layer deposition on the cutting faces of the indexable cutter inserts. Such a distribution is normally obtained in a CVD coating but not in a PVD coating. However, there are also applications for cutting tools, in which, as a function of the workpiece material and the cutting parameters, in the working primarily the flank face A or primarily the rake face B is stressed. This means that it is often desirable to maintain a specified layer thickness ratio between flank and rake face in order to protect as much as possible that face with a thicker layer without coating the non-stressed or less stressed face with too thick a layer, which would not be functional and, moreover, would only entail adhesion problems. The solution of this problem will be explained in conjunction with FIG. 10. As an example, this source disposition is assumed and the simple flat substrate carrier 6 for indexable cutter insert 7 disposed stationarily on a grid 25'. If it is now desired to increase the layer thickness on the flank face B, primarily those arc sources 8, 21 are operated which coat in the direction of this face, while all arc sources 8, 21 coating perpendicularly thereto are switched off or are operated with lower coating rate by setting the electric power supply. If the flank face is to be coated more thickly, the sources which permit a normal coating toward the flank face are operated accordingly and those perpendicular thereto are operated with a reduction or are switched off. It can be seen that this combination of laminar substrate mounting and directed PVD coating permits for the first time the setting of specific layer thickness ratios of flank and rake face without substrate rotation. This has not been possible with previously known coating systems. This property now makes possible realizing a highly application-related design for the indexable cutter insert coating. The statements regarding the layer thickness coordination can be analogously also applied to the combination of different materials, for example, a first material can be deposited preferably onto the flank face A and a second material preferably onto the rake face B, i.e. crater wear and flank face wear can be optimized separately and specific to the layer material, which until now has not been possible.

While specific embodiments of the invention have been shown and described in detail to illustrate the application of the principles of the invention, it will be understood that the invention may be embodied otherwise without departing from such principles.

What is claimed is:

1. A method for simultaneous coating of a plurality of substrates (7) with a hard material layer, by means of
a vacuum process chamber (1) connected with a pumping system (2) for evacuation,
at least one reactive gas inlet (12) which is connected to at least one reactive gas tank (13) for introduction of process gases,
at least two PVD coating sources (8, 21) with an anode (10) and a cathode (11) with a two-dimensionally extended surface for coating the substrates (7),
a substrate carrier (6) for the substrates (7),
a gate (4) arranged on the vacuum process chamber (1) for loading the chamber with the substrate carrier (6),
a transport device (5) for transferring the substrate carrier (6) through the gate (4) and positioning the substrate carrier in the vacuum process chamber (1) spaced in a region between the cathodes (11), and
a power supply (16, 18) for operating the PVD coating sources (8, 21), the method comprising the steps of:
providing the substrate carrier (6) with a two-dimensionally horizontally extended surface; and
applying two-dimensionally extended flat substrates along said horizontally two-dimensionally extended surface of the substrate carrier (6) so that the normals on the two-dimensionally extended surfaces of the substrates (7) are substantially perpendicular to normals on the two-dimensionally extended surfaces of the cathodes (11).

2. A method as claimed in claim 1, wherein the substrates (7) are coupled with a movement arrangement (26, 27, 30) and are disposed together in a plane on the substrate carrier (6), such that the substrates (7) are rotated.

3. A method as claimed in claim 1, including using as the PVD coating sources (8, 21) sputter or arc vaporizer sources.

4. A method as claimed in claim 1, including forming the substrate carrier (6) with a substrate rest (24) with a multiplicity of openings (25) into which the substrates (7) are placed, implemented as a grid structure which is held by an encompassing frame (23) and is comprised of an electrically conducting material.

5. A method as claimed in claim 1, including applying an electric bias power supply to the substrate carrier (6).

6. A method as claimed in claim 5, wherein the bias power supply outputs one of a DC, AC, MF, RF voltage or electric pulses, wherein the electrical bias power supply forms bipolar or unipolar pulses.

7. A method as claimed in claim 1, wherein two of the at least two PVD coating sources (8, 21) are substantially disposed opposite one another and the substrate carrier (6) located in a horizontal transport plane (3) is disposed spaced apart between the cathodes (11) such that the one source is positioned above and the other source below the substrate carrier (6) and these sources form a coating source pair (8, 21) directed toward one another.

8. A method as claimed in claim 7, wherein the cathodes (11) of the coating source pair (8, 21) are operated while connected with a pulsed current supply (17) and that at least one other coating source pair (8, 21) is operated with arc vaporizer sources.

9. A method as claimed in claim 1, wherein said substrates (7) are substantially plate shaped substrates with an extent in the range of 5 mm to 60 mm, said substantially plate shaped substrates being indexable cutter inserts.

10. A method as claimed in claim 1, wherein, as the process gases, one of the gases from the group consisting of nitrogen, oxygen, hydrocarbon gas, silane, borane, and hydrogen is introduced into the vacuum process chamber (1).

11. A method as claimed in claim 1, wherein, on the substrate carrier (6) for the simultaneous coating are disposed at least 30 and maximally 1000 substrates (7).

12. A method as claimed in claim 1, wherein between substrate carrier (6) and the PVD coating sources (8, 21) a relative movement takes place with the aid of a movement device (22), wherein the movement device (22) is a horizontal movement device and the substrate carrier (6) is moved.

13. A method as claimed in claim 1, wherein, with at least one cathode (11), a material selected from the group consisting of Al, Cr, Ti, Zr and their alloys are vaporized or sputtered and at least one reactive gas is supplied to a plasma process.

14. A method as claimed in claim 1, including, providing outside of the vacuum process chamber (1), a charging robot for loading or unloading the substrate carrier (6) with the substrates (7), wherein said robot is operationally connected with the transport device (5).

15. A method as claimed in claim 1, wherein the gate (4) is implemented as a loadlock through which the substrate carrier (6) can be inwardly or outwardly transferred into or out of the vacuum chamber (1).

16. A method as claimed in claim 1, wherein at least two vacuum chambers (1, 1a, 1b, 1c) are operationally connected communicating with one another via loadlocks, for the execution of several process steps, wherein at least in or on one of the vacuum chambers (1, 1a, 1b, 1c) at least one arc vaporizer source (8, 21) is operated.

17. A method as claimed in claim 1, wherein, on at least one side of the substrate carrier (6) at least two arc vaporizer sources (8, 8', 21, 21') are disposed and operated, and faces of the cathodes (11) are disposed at an inclination toward one another in a direction of the substrate carrier (6), and the sources are individually actuated.

18. A method as claimed in claim 1, wherein, on at least one side of the substrate carrier (6) at least four arc vaporizer sources (8, 8', 21, 21') are disposed and operated, and faces of the cathodes (11) are disposed at an inclination toward one another in a direction of the substrate carrier (6), and the sources are individually actuated.

19. A method as claimed in claim 1, wherein, on an active cutting edge (E') of the substrates a layer is deposited with a layer thickness in the range of 0.1 μm to 50 μm.

20. A method as claimed in claim 1, wherein the substrates (7) in the substrate carrier together with the PVD coating sources ensures an ongoing, uninterrupted exposure of at least an at least one active cutting edge (E') of the substrates (7), such that a material flow from the sources to the substrate is not interrupted during the entire duration of a coating process, wherein a maximal variation of a material flow of ±30% is maintained.

21. A method as claimed in claim 1, wherein a coating of the plurality of substrates (7) on the substrate carrier (6) takes place within a cycle time of less than 3.0 hours.

22. A method as claimed in claim 1, wherein, on flank faces (B) and rake faces (A) of the substrates (7), at least along and lateral of a cutting edge (E) on both faces, different layer thicknesses are set through an individual setting of the power supply at the at least two PVD coating sources (8, 21).

23. A method as claimed in claim 1, wherein, on flank faces (B) and rake faces (A) of the substrates (7), at least along and lateral of a cutting edge (E) on both faces, different material compositions are set through the individual setting of the power supply at the at least two PVD coating sources (8, 21) which are equipped with different cathode materials.

24. The method according to claim 1, wherein the substrates (7) are coupled with a movement device (26, 27, 30) and are arranged in a plane on the substrate carrier (6).

25. The method according to claim 1, wherein the substrate carrier (6) comprises a substrate rest (24) with a plurality of openings (25) into which the substrates (7) are placed.

26. The method according to claim 25, wherein the substrate rest (24) is implemented as a grid structure.

27. The method according to claim 26, wherein the grid structure comprises an electrically conducting material.

28. The method according to claim 1, wherein the substrates (7) are coated by arc evaporation.

29. The method according to claim 1, wherein the substrates (7) are plate-shaped.

30. The method according to claim 29, wherein the plate-shaped substrates (7) have an extent in a range of 5 mm to 60 mm.

31. The method according to claim 1, wherein at least 30 substrates (7) are provided on the substrate carrier (6).

32. The method according to claim 1, wherein a relative movement between the substrate carrier (6) and the PVD coating sources (8, 21) is generated.

33. The method according to claim 1, wherein the substrates have side faces, and a layer with a layer thickness in a range of 0.1 μm to 50 μm is deposited onto at least a part of the side faces of the substrates (7).

34. The method according to claim 1, wherein the substrates (7) in the substrate carrier together with the arrangement of the PVD coating sources (8, 21) ensures a permanent uninterrupted exposure of at least active cutting edges (E') of the substrates (7) such that the material flow from the PVD coating sources (8, 21) to the substrate is not interrupted during the entire coating duration, and wherein a maximum variation of material flow of ±30% is maintained.

* * * * *